United States Patent
Dong et al.

(10) Patent No.: US 7,807,577 B2
(45) Date of Patent: Oct. 5, 2010

(54) FABRICATION OF INTEGRATED CIRCUITS WITH ISOLATION TRENCHES

(75) Inventors: Zhong Dong, Fremont, CA (US); Ching-Hwa Chen, Milpitas, CA (US)

(73) Assignee: ProMOS Technologies Pte. Ltd., Singapore (SG)

( * ) Notice: Subject to any disclaimer, the term of this patent is extended or adjusted under 35 U.S.C. 154(b) by 153 days.

(21) Appl. No.: 12/196,067

(22) Filed: Aug. 21, 2008

(65) Prior Publication Data

US 2010/0047994 A1 Feb. 25, 2010

(51) Int. Cl.
  *H01L 21/311* (2006.01)
(52) U.S. Cl. .................. 438/700; 438/197; 438/680; 257/E21.17; 257/E21.249; 257/E21.278; 257/E21.293; 257/E21.304; 257/E21.315; 257/E21.421
(58) Field of Classification Search .............. 438/700, 438/257, 259, 289, 430, 505, 508, 680, 692, 438/723, 724, 593, 197; 257/E21.17, 249, 257/278, 293, 304, 315, 421
See application file for complete search history.

(56) References Cited

U.S. PATENT DOCUMENTS

| 6,265,285 | B1 | 7/2001 | Tseng |
| 6,355,524 | B1 | 3/2002 | Tuan et al. |
| 7,038,291 | B2 | 5/2006 | Goda et al. |
| 7,303,964 | B2 | 12/2007 | Shiraiwa et al. |
| 7,402,886 | B2 * | 7/2008 | Yuan .......................... 257/510 |
| 2008/0153234 | A1 | 6/2008 | Lee |

* cited by examiner

*Primary Examiner*—David Nhu
(74) *Attorney, Agent, or Firm*—Haynes and Boone, LLP; Michael Shenker

(57) ABSTRACT

After forming a stack of layers (130, 140, 310) for a transistor or a charge-trapping memory over an active area (110), and before etching isolation trenches (160) in the semiconductor substrate (120) with the stack as a mask, spacers (610) are formed on the stack's sidewalls. The trench etch may include a lateral component, so the top edges of the trenches may be laterally recessed to a position under the spacers or the stack. After the etch, the spacers are removed to facilitate filling the trenches with the dielectric (to eliminate voids at the recessed top edges of the trenches). Other embodiments are also provided.

15 Claims, 6 Drawing Sheets

FABRICATION OF INTEGRATED CIRCUITS WITH ISOLATION TRENCHES

BACKGROUND OF THE INVENTION

The present invention relates to integrated circuits, and more particularly to integrated circuits with isolation trenches that isolate active areas in a semiconductor substrate.

FIG. 1 illustrates a vertical cross section of an integrated circuit in the process of forming self-aligned shallow trench isolation (STI) regions between active areas 110 of a monocrystalline silicon substrate 120. A similar process is disclosed in U.S. Pat. No. 6,355,524 issued Mar. 12, 2002 to Tuan et al. and incorporated herein by reference. The integrated circuit is a flash memory with floating gates. A silicon dioxide layer 130 has been formed on silicon substrate 120. A doped polysilicon layer 140 has been formed on oxide 130 to provide the floating gates. A sacrificial layer 150 of silicon nitride has been formed on polysilicon 130 and patterned photolithographically to define the active areas 110 and isolation trenches 160. Polysilicon 140, oxide 130, and silicon substrate 120 are etched with nitride 150 as a mask to form the trenches. The trenches are filled with silicon dioxide 170, which initially covers the nitride 150 but is then polished off from over the nitride by chemical mechanical polishing (CMP). Oxide 170 provides shallow trench isolation regions isolating the active areas 110 from each other.

Nitride 150 is etched away (FIG. 2A), and oxide 170 may be etched down to provide a more planar structure. FIG. 2B is a top view at this stage, with FIG. 2A corresponding to the vertical cross section along the line A-A' in FIG. 2B.

As shown in FIG. 3A (vertical cross section marked A-A' in FIGS. 2B and 3B) and FIG. 3B (top view), dielectric 310 is formed on polysilicon 140 and STI oxide 170. Doped polysilicon 320 is deposited on dielectric 310. Additional layers (not shown) may be deposited on top. Then a mask (not shown) is formed to define the control gates. Layers 320, 310, 140, 130 are etched as defined by that mask to form control gates from polysilicon 320 and to separate adjacent floating gates 140 in each column from each other. STI oxide 170 may be slightly etched in this process. A suitable dopant is implanted to form source/drain regions 330 in substrate 120 on the opposite sides of each control gate line 320.

Improved fabrication techniques are desired.

SUMMARY

This section summarizes some features of the invention. Other features may be described in the subsequent sections. The invention is defined by the appended claims, which are incorporated into this section by reference.

The etch of silicon substrate 120 to form trenches 160 is typically a vertical etch, but the etch may undesirably attack silicon 120 under the oxide 130 as shown in FIG. 4. The top edges of trenches 160 become laterally recessed away from the overhanging edges over oxide 130 and the overlying layers. Consequently, when the trenches are later filled with dielectric 170, voids 510 (FIG. 5) may undesirably form under oxide 130. These voids may entrap particulate or gaseous contaminants, compromising the reliability of the integrated circuit and the manufacturing yield.

In some embodiments of the present invention, the trenches are made as follows. First, the layers 150, 140, 130 are etched as described above in connection with FIG. 1, but the etch is stopped before trench formation. This etch creates a number of stacks of layers 130, 140, 150. Then spacers are formed on the stacks' sidewalls, between the stacks. Then the silicon substrate 120 is etched to form the trenches. The etch of substrate 120 may attack the silicon laterally under the spacers and possibly even under oxide 130 (like in FIG. 4). However, before the trenches are filled with dielectric 170, the spacers are removed to expose the trench edges or at least to make the trench edges more accessible for subsequent formation of oxide 170. Therefore, the voids are eliminated or at least reduced.

The invention is not limited to the features and advantages described above except as defined by the appended claims.

DESCRIPTION OF SOME EMBODIMENTS

The embodiments described in this section illustrate but do not limit the invention. For example, the invention is not limited to specific materials, dimensions, circuits, or fabrication processes except as defined by the appended claims.

Figure 6:
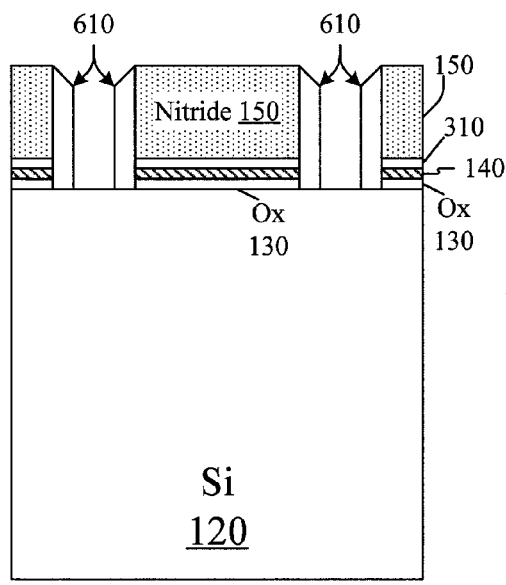

FIG. 6 illustrates a vertical cross section of an exemplary embodiment of the present invention at an early stage of fabrication. This embodiment is a flash memory, except that the charge storage elements 140 are dielectric (e.g. silicon nitride). In other embodiments, the charge storage elements are conductive as in FIGS. 1-5, or nanocrystalline, or maybe some other kind.

Figure 1:
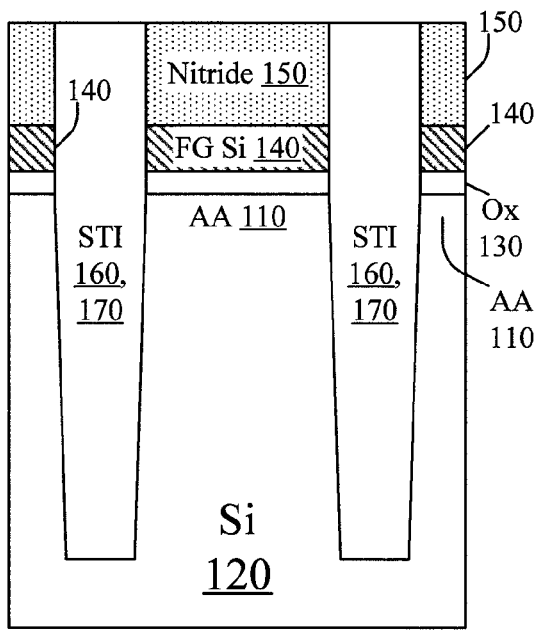
FIGS. 1, 2A show vertical cross sections of an integrated circuit in the process of fabrication in prior art.
Figure 2A:
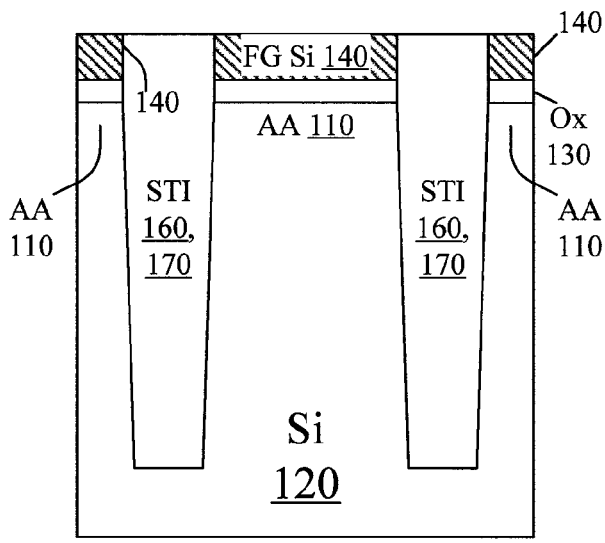
Figure 2B:
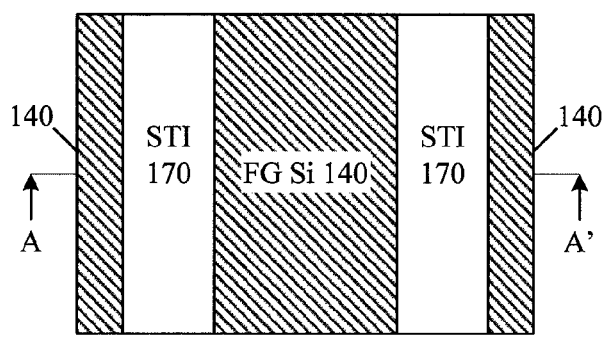
FIG. 2B is a top view of the circuit of FIG. 2A.
Figure 3A:
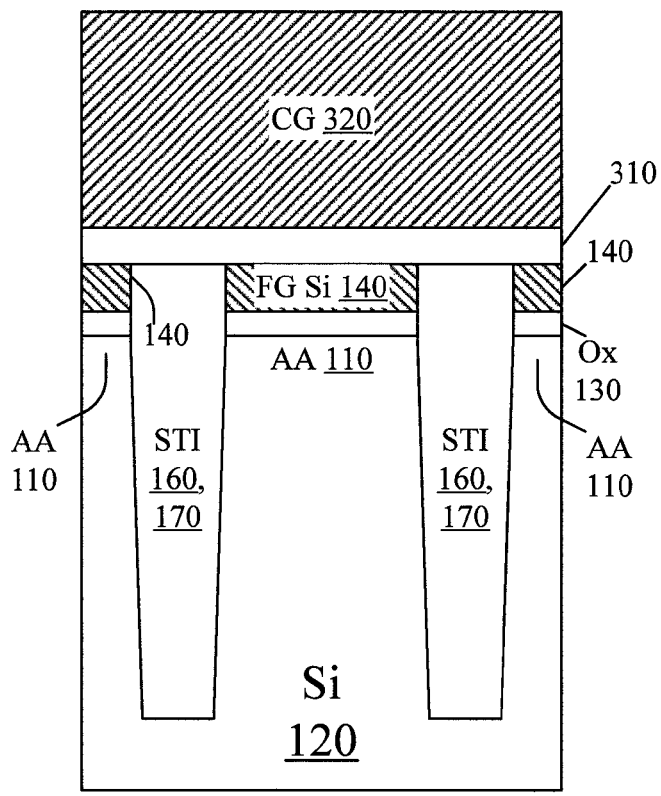
FIG. 3A shows a vertical cross section of an integrated circuit in the process of fabrication in prior art.
Figure 3B:
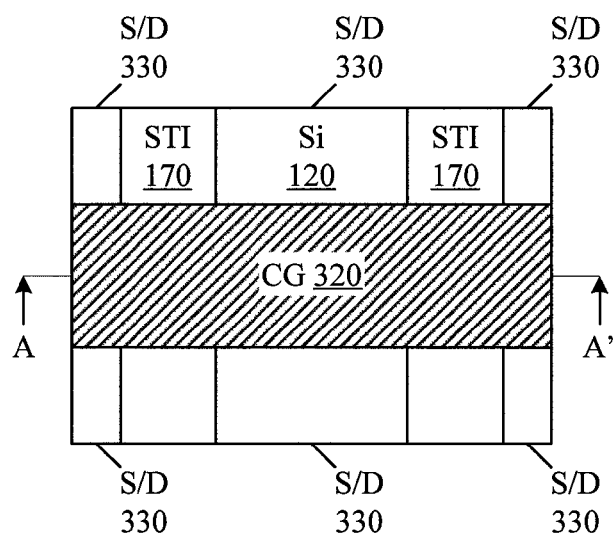
FIG. 3B is a top view of the circuit of FIG. 3A.
Figure 4:
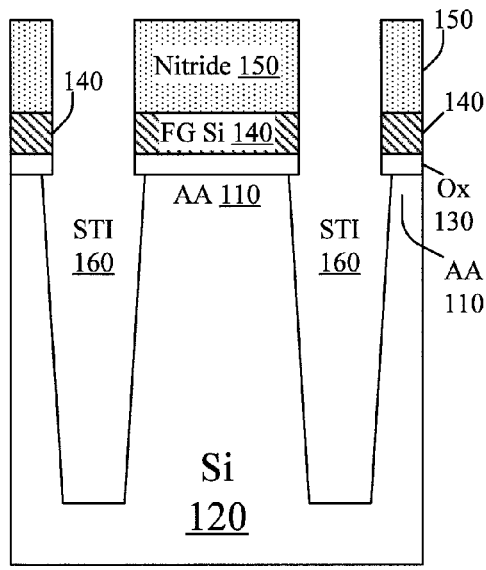
FIGS. 4-12 show vertical cross sections of integrated circuits at different stages of fabrication according to some embodiments of the present invention.
Figure 5:
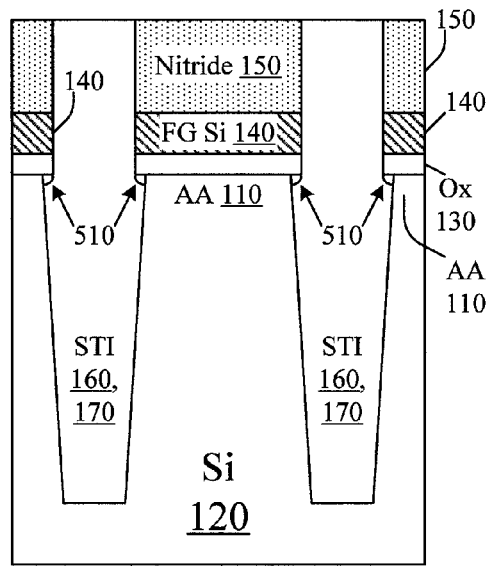

The fabrication may start as in FIG. 1. Semiconductor substrate 120 may be monocrystalline silicon or some other kind, suitably doped (e.g. to type P). Dielectric 130, e.g. silicon dioxide, is formed on substrate 120 (by thermal oxidation or chemical vapor deposition (CVD)) to a suitable thickness. Dielectric 130 will serve as a tunnel dielectric through which charges are tunneled to and/or from the charge storage elements 140 to program and/or erase the memory. Dielectric 140 is deposited on oxide 130 to provide the charge storage elements. Blocking dielectric 310 (e.g. silicon dioxide or aluminum oxide) is deposited on dielectric 140. Silicon nitride 150 is deposited and photolithographically patterned to define the STI trenches 160 and the active areas 110. The layers 310, 140, 130 are etched with nitride 150 as a mask to expose the substrate 120 in the STI areas. The remaining portions of layers 130, 140, 310, 150 form a number of stacks on substrate 120.

Spacers 610 are formed on the stacks' sidewalls by conformal deposition and then a preferentially vertical etch of a suitable material. The spacers will serve as part of a mask for the etch of the STI trenches, and the spacer material can be chosen based on the etching process and the pertinent dimensions. For example, in some embodiments, the combined thickness of layers 130, 140, 310, 150 is about 100 nm; the trenches will be 300 nm deep; and the material 610 can be aluminum oxide of 1~3 nm thickness, or silicon dioxide or silicon nitride of 10~20 nm thickness, depending on the selectivity of the silicon etch. These examples are not limiting.

Note U.S. Pat. No. 7,402,886, issued Jul. 22, 2008 to Yuan, incorporated herein by reference.

The bottom surface of spacers 610 physically contacts substrate 120. The substrate is exposed between the spacers.

Figure 7:
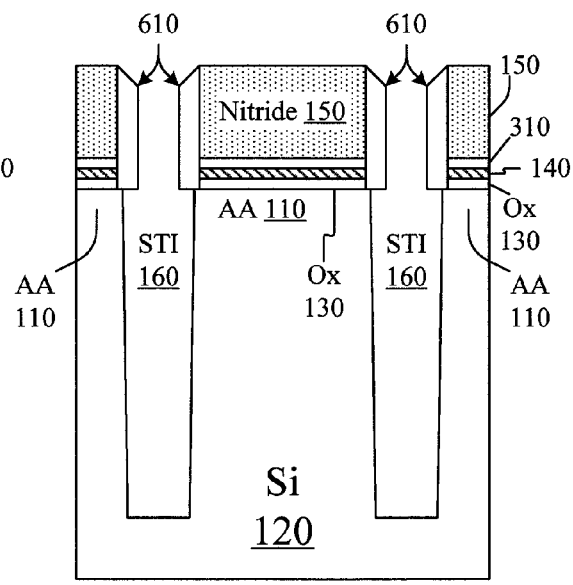

As shown in FIG. 7, substrate 120 is etched selectively to nitride 150 and spacers 610 to form the trenches 160 between the spacers. This is a preferentially vertical etch, but silicon 120 may be slightly etched laterally. If so, the top edges of trenches 160 may become laterally recessed relative to the outside edges of spacers 610 and may even reach a position underneath oxide 130 (this is not shown in the drawings). The exact geometry depends on the etch selectivity to spacers 610 as the etch may laterally attack the spacers to some extent.

Figure 8:
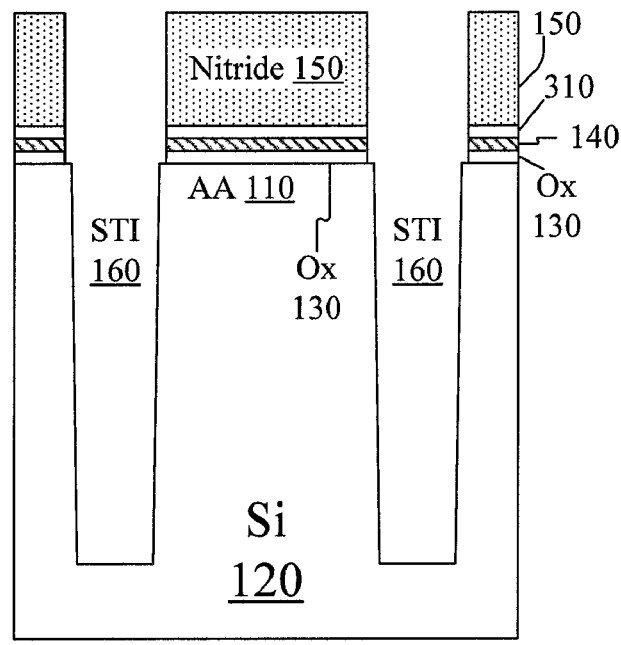

As shown in FIG. 8, spacers 610 are removed by a suitable etch. Nitride 150 remains in place, though it can be slightly etched during the spacer removal. The top edges of trenches 160 and the adjacent areas at the top of substrate 120 are now exposed. Therefore, it will be easier to avoid voids at the top edges of the trenches when forming the STI dielectric 170. Even if the top edges of the trenches were not exposed but were overhung by oxide 130, the top edges become laterally more accessible due to the spacer removal, so the void formation is less likely.

Figure 9:
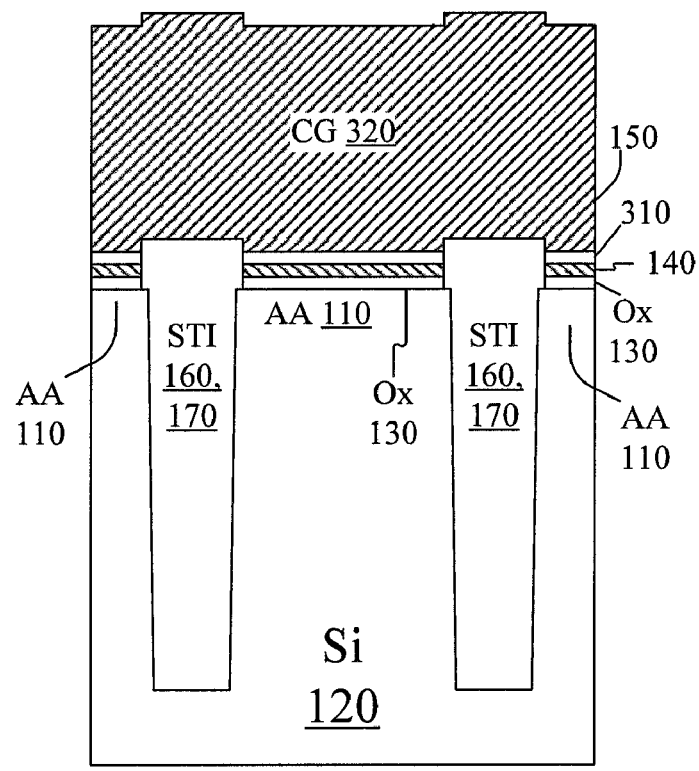

The remaining fabrication steps can be as described above in connection with FIGS. 3A, 3B. For example, silicon oxide 170 (FIG. 9) can be formed by thermally oxidizing the exposed silicon 120 and then depositing silicon dioxide by CVD. Oxide 170 initially covers the nitride 150 but is then polished and/or etched down to expose the nitride. The oxide 170 can be etched down to a level below the top surface of nitride 150. Nitride 150 is then etched away. Doped polysilicon 320 is deposited, and the layers 320, 310, 140, 130 are patterned using a suitable mask (not shown). The top view of the resulting structure can be as in FIG. 3B. Source/drain regions 330 can be formed by doping (to type N for example) as in prior art.

Figure 10:
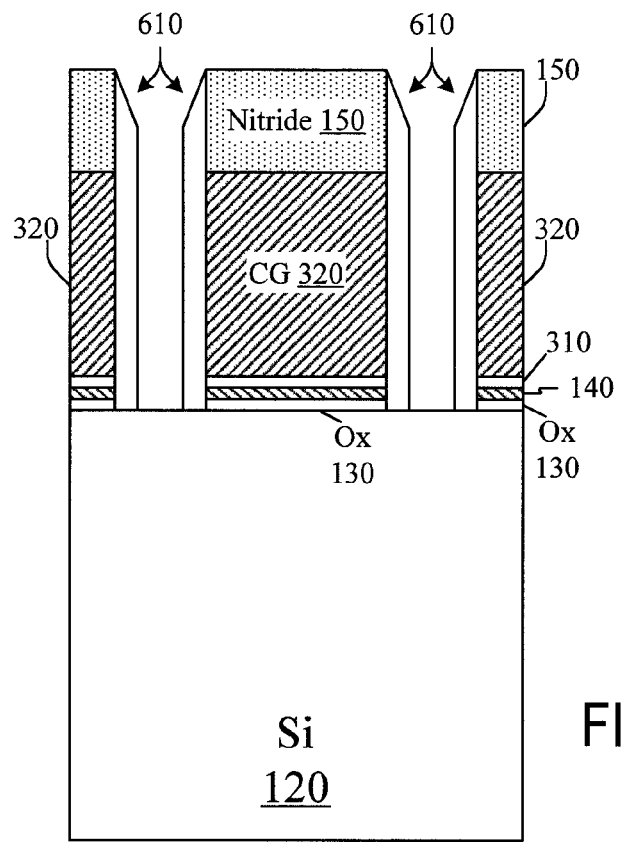
Figure 11:
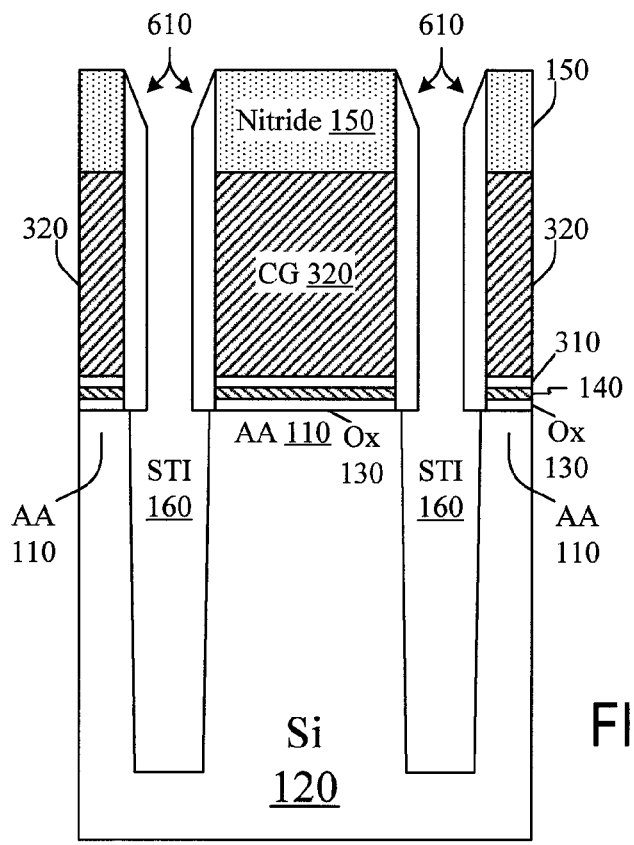
Figure 12:
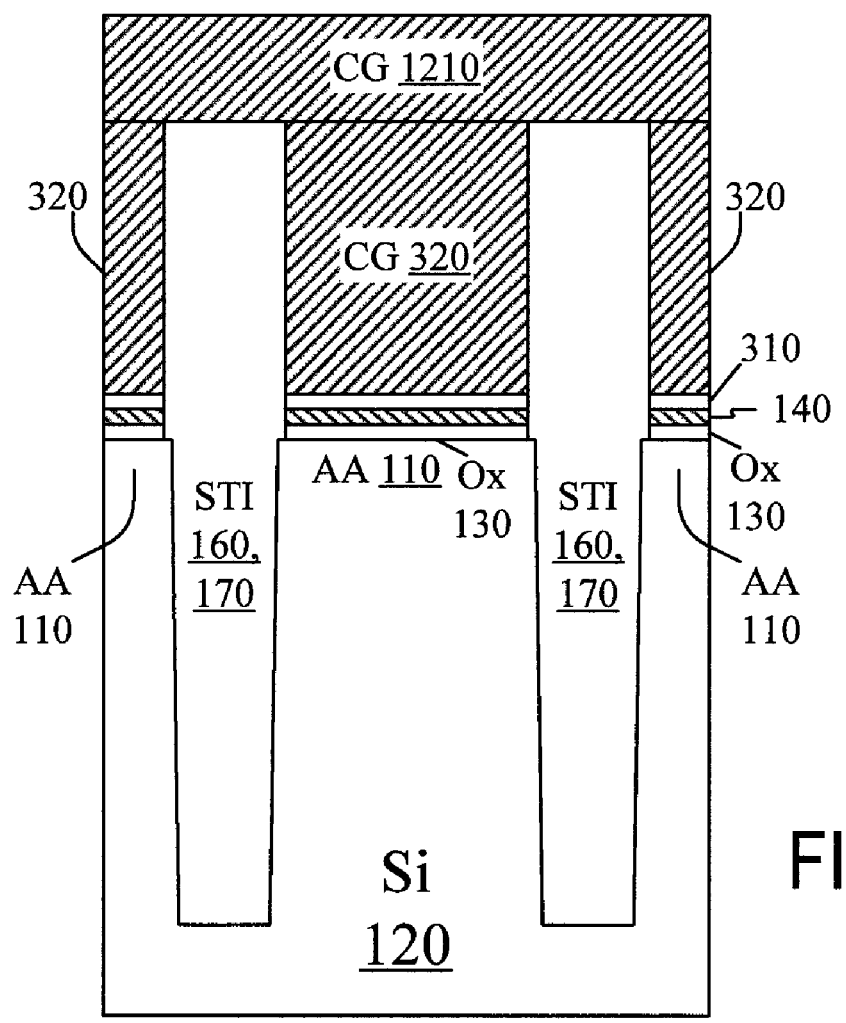

The invention is not limited to the embodiments described above. For example, dielectric 310 (FIG. 6) can be deposited after the removal of nitride 150 as in FIGS. 2A, 3A. Alternatively, both dielectric 310 and polysilicon 320 can be deposited before nitride 150 as shown in FIG. 10. Then spacers 610 can be formed on the sidewalls of each stack of layers 130, 140, 310, 320, 150. FIG. 11 shows the structure after the trench etch. Then spacers 610 are removed, and dielectric 170 is formed. Nitride 150 may or may not be removed as desired. For example, as shown in FIG. 12, nitride 150 may be removed after formation of dielectric 170, and then dielectric 170 can be etched down to the level, or below the level, of the top surface of polysilicon 320, and additional polysilicon 1210 can then be deposited and patterned to provide control gate lines which consist of two layers 320, 1210 and in top view are as control gate lines 320 in FIG. 3B.

The invention is not limited to any geometry of trenches 160. For example, the trenches may completely laterally surround the active area 110 of each memory cell.

The invention is not limited to a specific memory architecture. For example, select gates may be formed after the control gate fabrication. The invention is not limited to memories. For example, in some embodiments, layer 140 is a gate of a MOS transistor, or layers 140 and 310 may be absent and layer 320 may be a gate of a MOS transistor.

Some embodiments of the present invention provide a method for fabricating an integrated circuit, the method comprising the following operations (a) through (d). The operation (a) consists in obtaining a structure comprising a first feature overlying an active area of a semiconductor substrate. For example, the first feature may be a stack of layers 130, 140, 310, 150 plus spacers 610 in FIG. 6, or may include polysilicon 320 in FIG. 10. The first feature comprises at least a part of a circuit element (e.g. 140) controlling a conductivity of the active area. The first feature comprises a sidewall structure (e.g. all or a part of spacers 610) having a bottom surface contacting the semiconductor substrate.

The operation (b) consists in etching the semiconductor substrate selectively to the first feature to form an isolation trench (e.g. 160) for isolating the active area, the isolation trench having an edge adjacent to the sidewall structure.

The operation (c) is performed after operation (b) and consists in removing the sidewall structure. This may be removal of at least part of spacers 610 to obtain the structure of FIG. 8 for example. Of note, in some embodiments, only part of spacers 610 is removed.

The operation (d) is performed after operation (c) and consists in forming a dielectric (e.g. 170) in the trench.

In some embodiments, removing the sidewall structure comprises exposing the isolation trench's top edge from above. See e.g. FIG. 8. In some embodiments, not only the trenches' edges but also adjacent portions of the semiconductor substrate's top surface outside of the trenches are exposed. Thus, in FIG. 8, the top surface of substrate 120 between the trenches and the stacks of layers 130, 140, 310, 150 are exposed.

In some embodiments, the operation (a) comprises: forming a sub-feature (e.g. a stack of layers 130, 140, 310, 150), the sub-feature comprising one or more layers over the active area, the sub-feature comprising a sidewall; and then forming the sidewall structure on the sub-feature's sidewall (e.g. forming the spacers 610 on the stacks' sidewalls).

In some embodiments, forming the sidewall structure comprises depositing a conformal layer (e.g. 610) and then preferentially vertically etching the conformal layer.

In some embodiments, said at least a part of the circuit element (e.g. 140 or 320 in FIG. 10) has a portion on the sub-feature's sidewall.

The features discussed above are not limiting except as defined by the appended claims.

The invention claimed is:

1. A method for fabricating an integrated circuit, the method comprising:
  (a) obtaining a structure comprising a first feature overlying an active area of a semiconductor substrate, the first feature comprising at least a part of a circuit element controlling a conductivity of the active area, the first feature comprising a sidewall structure having a bottom surface contacting the semiconductor substrate;
  (b) etching the semiconductor substrate selectively to the first feature to form an isolation trench for isolating the active area, the isolation trench having a top edge adjacent to the bottom surface of the sidewall structure;
  (c) after operation (b), removing the sidewall structure;
  (d) after operation (c), forming a dielectric in the isolation trench below the top edge.

2. A method for fabricating an integrated circuit, the method comprising:
  (a) obtaining a structure comprising a first feature overlying an active area of a semiconductor substrate, the first feature comprising at least a part of a circuit element controlling a conductivity of the active area, the first feature comprising a sidewall structure having a bottom surface contacting the semiconductor substrate;
  (b) etching the semiconductor substrate selectively to the first feature to form an isolation trench for isolating the active area, the isolation trench having a top edge adjacent to the sidewall structure;
  (c) after operation (b), removing the sidewall structure;

(d) after operation (c), forming a dielectric in the isolation trench;

wherein removing the sidewall structure comprises exposing the isolation trench's top edge from above.

3. The method of claim 2 wherein removing the sidewall structure comprises exposing, from above, the isolation trench's top edge and an adjacent portion of the semiconductor substrate's top surface outside of the isolation trench.

4. A method for fabricating an integrated circuit according to claim 1 wherein operation (a) comprises:

forming a sub-feature of the first feature, the sub-feature comprising one or more layers over the active area, the sub-feature comprising a sidewall; and then forming the sidewall structure on the sub-feature's sidewall.

5. A method for fabricating an integrated circuit according to claim 4 wherein forming the sidewall structure comprises depositing a conformal layer and then preferentially vertically etching the conformal layer to form the sidewall structure from the conformal layer.

6. A method for fabricating an integrated circuit according to claim 4 wherein said at least a part of the circuit element has a portion on the sub-feature's sidewall.

7. A method for fabricating an integrated circuit according to claim 1 wherein said at least a part of the circuit element becomes exposed when the sidewall structure is removed.

8. A method for fabricating an integrated circuit according to claim 1 wherein the circuit element is a transistor gate.

9. A method for fabricating an integrated circuit according to claim 1 wherein the circuit element is a charge storage element of a nonvolatile memory cell, the charge storage element comprising a dielectric.

10. A method for fabricating an integrated circuit, the method comprising:

(a) obtaining a structure comprising a first feature overlying an active area of a semiconductor substrate, the first feature comprising at least a part of a circuit element controlling a conductivity of the active area, the first feature comprising a sidewall structure having a bottom surface contacting the semiconductor substrate;

(b) etching the semiconductor substrate selectively to the first feature to form an isolation trench for isolating the active area, the isolation trench having a first portion adjacent to the bottom surface of the sidewall structure;

(c) after operation (b), removing the sidewall structure;

(d) after operation (c), forming a dielectric in the isolation trench below the first portion.

11. A method for fabricating an integrated circuit according to claim 10 wherein operation (d) comprises forming the dielectric on a sidewall of the isolation trench below the first portion.

12. A method for fabricating an integrated circuit according to claim 10 wherein operation (a) comprises:

forming a sub-feature of the first feature, the sub-feature comprising one or more layers over the active area, the sub-feature comprising a sidewall; and then forming the sidewall structure on the sub-feature's sidewall;

wherein said at least a part of the circuit element has a portion on the sub-feature's sidewall.

13. A method for fabricating an integrated circuit according to claim 10 wherein said at least a part of the circuit element becomes exposed when the sidewall structure is removed.

14. A method for fabricating an integrated circuit according to claim 10 wherein the circuit element is a transistor gate.

15. A method for fabricating an integrated circuit according to claim 10 wherein the circuit element is a charge storage element of a nonvolatile memory cell, the charge storage element comprising a dielectric.

* * * * *